(12) United States Patent
Zhang et al.

(10) Patent No.: US 7,813,452 B2
(45) Date of Patent: *Oct. 12, 2010

(54) LIMITER BASED ANALOG DEMODULATOR

(75) Inventors: Zhongxuan Zhang, Fremont, CA (US);
Lixin Zhao, Shanghai (CN); Steve Xuefeng Jiang, Fremont, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 12/488,825

(22) Filed: Jun. 22, 2009

(65) Prior Publication Data
US 2009/0268801 A1   Oct. 29, 2009

Related U.S. Application Data

(63) Continuation of application No. 11/307,015, filed on Jan. 19, 2006, now Pat. No. 7,551,694.

(60) Provisional application No. 60/645,847, filed on Jan. 20, 2005.

(51) Int. Cl.
*H04L 27/14* (2006.01)
(52) U.S. Cl. ............... 375/326; 375/232; 375/229; 375/350; 375/244; 370/442; 370/354; 370/503; 348/614; 348/607
(58) Field of Classification Search ................ 375/232, 375/326, 229, 350, 224; 370/442, 354, 503; 348/614, 607
See application file for complete search history.

(56) References Cited

U.S. PATENT DOCUMENTS

| 6,031,880 | A | 2/2000 | Li et al. |
| 6,104,237 | A | 8/2000 | Mabuchi |
| 6,868,129 | B2 | 3/2005 | Li et al. |
| 6,959,057 | B1 | 10/2005 | Tuohino |
| 7,154,967 | B2 * | 12/2006 | Boutros et al. .............. 375/343 |
| 7,280,618 | B2 | 10/2007 | Demir et al. |
| 7,298,420 | B2 | 11/2007 | Lee |
| 2004/0264601 | A1 | 12/2004 | Demir et al. |
| 2005/0185743 | A1 * | 8/2005 | Li .............................. 375/350 |
| 2006/0291550 | A1 * | 12/2006 | Wang et al. ................. 375/229 |
| 2007/0198625 | A1 * | 8/2007 | Torosyan .................... 708/490 |

OTHER PUBLICATIONS

Yoichi Matsumoto, Shuji Kubota, Shuzo Kato; "High-Performance Coherent Demodulator LSIC for Wireless Personal Communications"; IEEE Transactions on Vehicular Technology, vol. 45, No. 3, Aug. 1996; pp. 475-483.
Notification of Transmittal of the International Search Report and The Written Opinion of The International Searching Authority, or the Declaration dated Jun. 6, 2008 in reference to PCT/US2006/01898.

* cited by examiner

*Primary Examiner*—Eva Y Puente

(57) ABSTRACT

A phase detector includes a decimator to decimate a digitized in-phase signal and a digitized quadrature signal to N times a symbol rate, where N is an integer greater than one. A burst detector to detect bursts in an output of the decimator. A carrier offset block to determine an offset angle based on an output of the burst detector. A rotator to generate a rotated signal by rotating the output of the decimator based on the offset angle determined by the carrier offset block. An equalizer to perform coherent demodulation of the rotated signal.

8 Claims, 3 Drawing Sheets

LIMITER BASED ANALOG DEMODULATOR

REFERENCES TO RELATED APPLICATIONS

This application is a continuation of U.S. patent application Ser. No. 11/307,015, filed Jan. 19, 2006, which application claims priority of U.S. Provisional Patent Application No. 60/645,847, filed Jan. 20, 2005 which are incorporated herein by reference in their entirety.

FIELD OF THE INVENTION

This invention relates generally to the field of demodulating transmission signals and, more particularly, to a demodulator employing analog phase detection of the signal prior to analog to digital conversion.

BACKGROUND OF THE INVENTION

Legacy communications systems such as the Personal Handy-phone System (PHS) are configured to be simple and low cost. Differential demodulation has been adopted based on the technological constraints present at the time of designing these systems for baseband demodulation and therefore does not have the capability to combat inter-symbol-interference typically introduced by multi-path fading.

It is therefore desirable to provide a modernized baseband design compatible with or to retrofit these legacy systems. It is further desirable to employ advanced DSP algorithms and introduce adaptive equalization to realize coherent demodulation.

SUMMARY OF THE INVENTION

A limiter based analog demodulator incorporating the present invention includes a power amplifier receiving a baseband signal and a local clock operating at the base-band frequency. A first multiplier receives an output from the power amplifier and the local clock to provide an in phase signal. A quadrature phase shifter receives the local clock and a second multiplier receives the output from the power amplifier and an output from the phase shifter provides a quadrature signal. A first analog filter receives the in phase signal and a second analog filter receives the quadrature signal. A first analog to digital converter connected to the first analog filter provides a digitized in phase signal and a second analog to digital converter connected to the second analog filter provides a digitized quadrature signal. The phase detector then receives the digitized in phase and quadrature signals.

BRIEF DESCRIPTION OF THE DRAWINGS

These and other features and advantages of the present invention will be better understood by reference to the following detailed description when considered in connection with the accompanying drawings wherein.

DETAILED DESCRIPTION OF THE INVENTION

Figure 1:
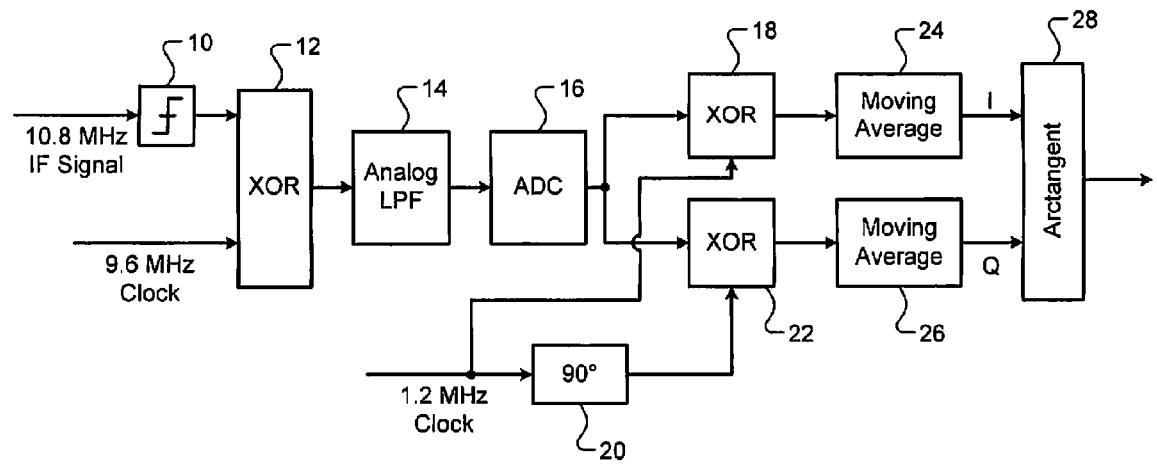
FIG. 1 is a block diagram of the elements of prior art limiter based PHS demodulation architecture.

The present invention is defined for an exemplary embodiment employed with a PHS communication system and standard. Shown in FIG. 1 is a limiter based PHS demodulation architecture which is typically employed. The 10.8 MHz IF signal received for demodulation is passed through the power amplifier 10 and mixed through an Exclusive Or 12 with a 9.6 MHz clock prior to filtering in an analog low pass filter (LPF) 14. The filtered signal is then converted to the digital domain in Analog to Digital converter (ADC) 16. The local 1.2 MHz oscillator is mixed 18 with the In-phase (I) signal and, after phase shifting 20 of 90° is mixed 22 with the Quadrature (Q) signal. A moving average is created of the I and Q signals, 24 and 26 respectively and the phase angle is calculated using the arctangent of I and Q 28. The moving average on relative phase difference to the local carrier is done in the digital domain, for example at 100 times symbol rate. Due to the effects of digital sampling, a difference between the output of the phase detector and an ideal phase detector will always be present.

Figure 2:
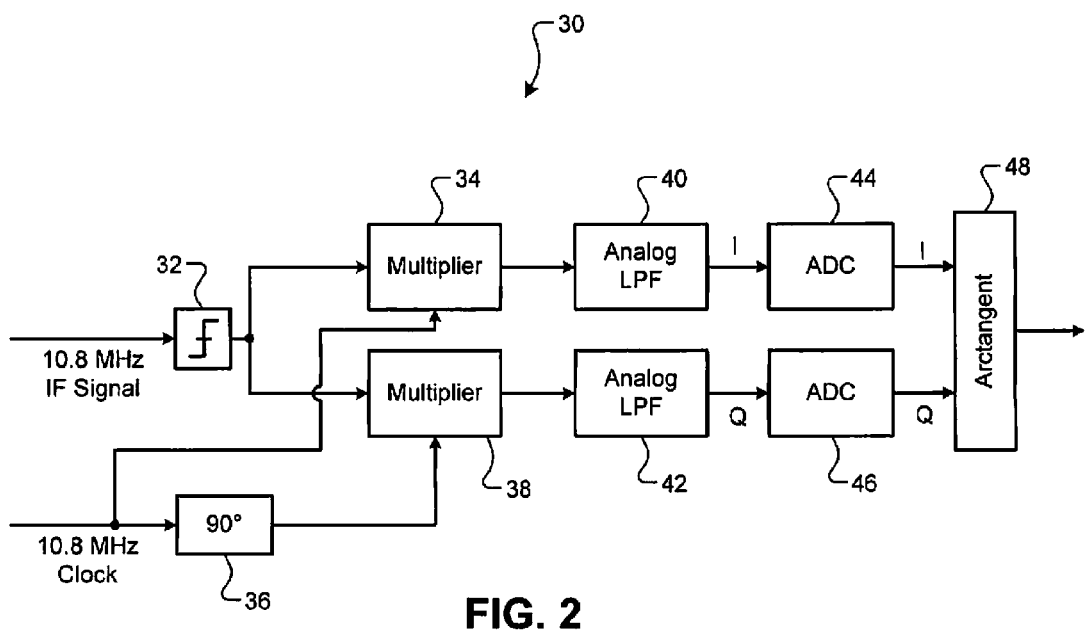
FIG. 2 is a block diagram of the elements of the present invention.

FIG. 2 shows an analog down mixer 30 according to the present invention. The 10.8 MHz IF signal is received in a power amplifier 32. The signal is mixed with a local clock, also operating at 10.8 MHz, in phase in multiplier 34 and phase shifted 90° 36 in multiplier 38. The two signals are then filtered with analog LPFs, 40 and 42 respectively. The two signals are then converted through ADCs 44 and 46 to provide digital domain I and Q. An arctangent function 48 operating on I and Q provides the phase difference for symbol decoding.

Figure 3:
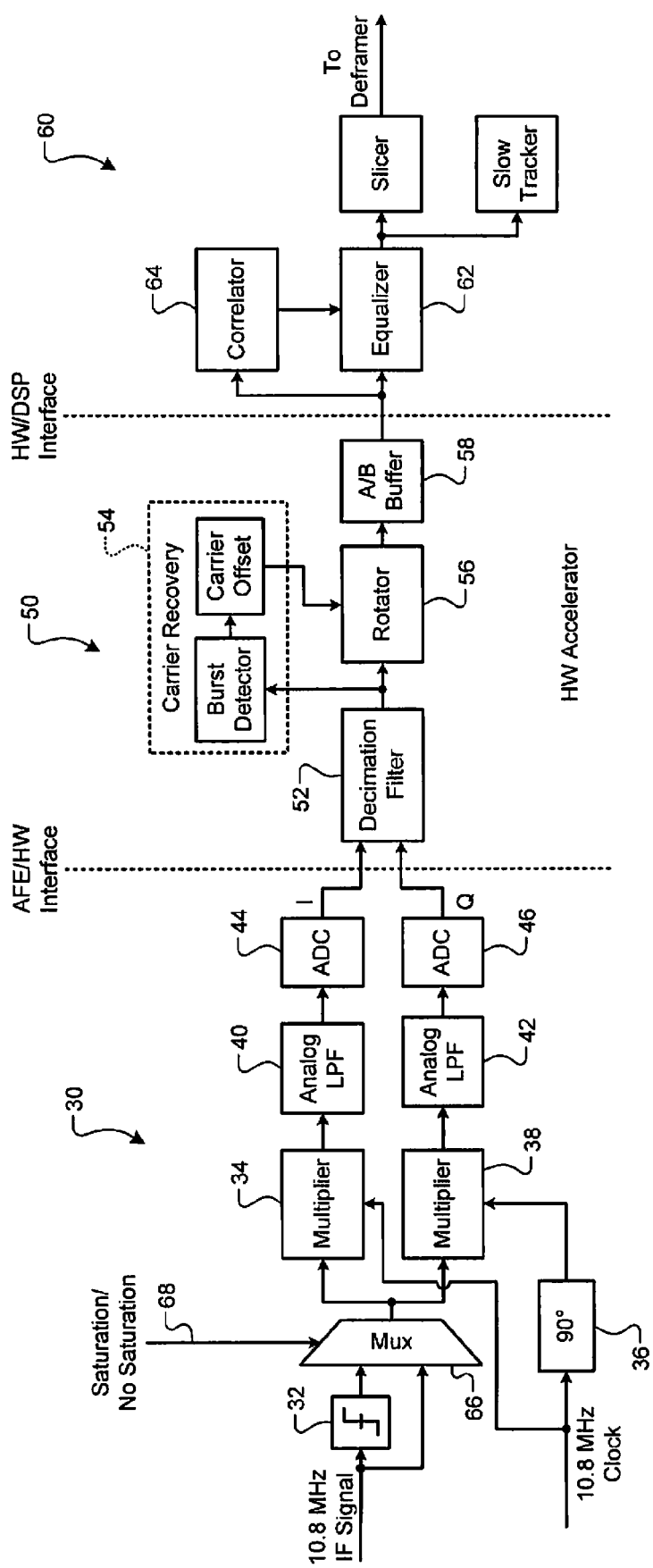
FIG. 3 shows an embodiment for a receiver employing coherent demodulation with adaptive equalization in which the phase detector of the present invention is employed.

The down mixer of the present invention implemented in a receiver system is shown in FIG. 3. The converted digital signal from the ADCs 44 and 46 from the down mixer 30 is passed to a hardware accelerator 50 and further filtered and decimated 52 to 3× symbol rate, e.g. 576 kHz. This signal first passes a Carrier Recovery block 54 and then a Rotator block 56 and then to a storage register 58 which for the embodiment disclosed herein is a dual or A/B register. The function of Carrier Recovery block is to detect the burst and estimate carrier frequency offset between received and transmitted signals. This allows the following Rotator block 56 to compensate for carrier offset. This rotated signal is then passed to a DSP 60 with an Equalizer 62. An adaptive decision-directed equalizer is applied where the training sequence is the unique word (UW) in the burst. Therefore an accurate position of UW is required. This information is acquired via a correlation block 64. The input data is correlated with UW and therefore, after the peak of the correlation result is detected, the UW location in the burst data can be determined. This process, typically known as conventional coherent detection, is employed in the present invention even though the base-band modulation is DQPSK. Theoretically this kind of coherent detection can have 3 dB better performance than differential detection.

The embodiment shown in FIG. 3 is further equipped to provide a selection of detection modes. Saturation of the received signal amplitude in the amplifier will destroy the signal phase information, which is critical to PI/4 DQPSK demodulation. Therefore, to allow differential detection, a multiplexer 66 is inserted in the signal path to receive either the output of the amplifier 32 or the input signal directly. The multiplexer signal selection is controlled by a saturation/no saturation signal 68. Saturation versus no saturation is equivalent to a non-equalization mode versus an equalization mode. Nonequalization mode provides basic differential detection. Alternatively, a PI/4 DQPSK signal can be detected with equalization techniques as described above. The saturation/non saturation signal is set by a register value according the desired system setting.

Figure 4:
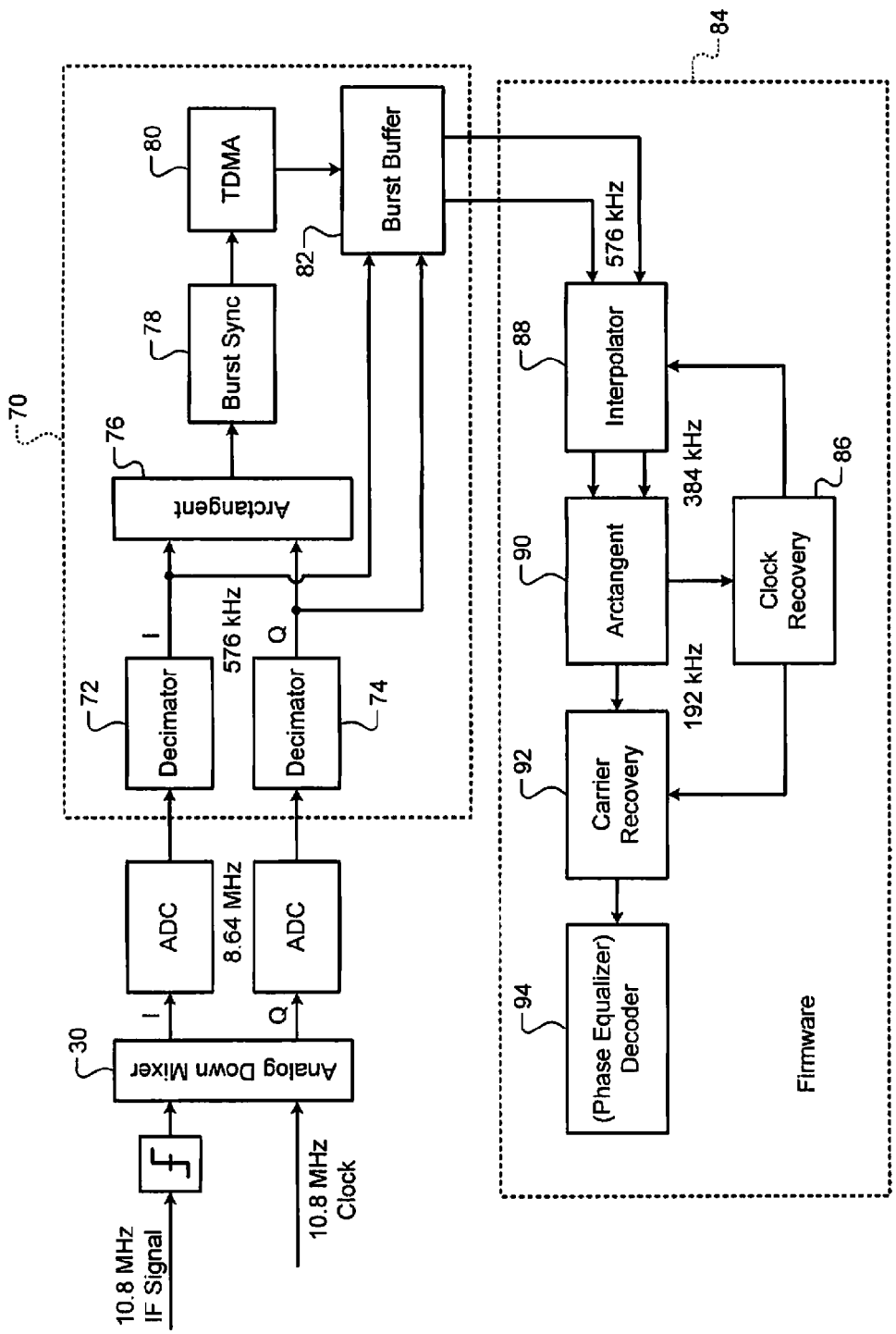
FIG. 4 shows an embodiment for a receiver employing coherent demodulation with differential decoding in which the phase detector of the present invention is employed.

The down mixer of the present invention implemented in an alternative receiver system is shown in FIG. 4. The converted digital signal from the ADCs 44 and 46 of the down mixer is passed to a hardware accelerator 70 and further filtered and decimated 72, 74 to 3× symbol rate, e.g. 576 kHz before being acted on by an arctangent function 76. This signal first passes a Burst Sync block 78 and then a TDMA block 80 to generate a slot timing signal to control a storage register 82 which for the embodiment disclosed herein is a dual or A/B register (Burst Buffer). The TDMA slot synchronized signals are then passed to the DSP processor 84 through the burst buffer 82. The firmware implemented Clock Recovery block 86 will estimate the timing offset and pass the parameter to the firmware implemented Interpolator block 88 to do timing adjustment and 3 to 2 rate conversion. The converted signal will be passed to ArcTan block 90 to convert the in phase and quadrature signals into the phase signal. The converted phase signal will be passed to Carrier Recovery block 92 and Decoder block 94 to do carrier offset adjustment and final decoding.

Having now described the invention in detail as required by the patent statutes, those skilled in the art will recognize modifications and substitutions to the specific embodiments disclosed herein. Such modifications are within the scope and intent of the present invention as defined in the following claims.

What is claimed is:

1. A phase detector, comprising:
a decimator to decimate a digitized in-phase signal and a digitized quadrature signal to N times a symbol rate, where N is an integer greater than one;
a burst sync block to detect bursts in an output of the decimator;
a time division multiple access (TDMA) block to generate a slot timing signal based on an output of the burst sync block;
a clock recovery block to estimate a timing offset based on the slot timing signal;
an interpolator to perform timing adjustment and rate conversion based on the timing offset;
an arctangent block to convert an output of the interpolator into a phase signal;
a carrier recovery block to perform carrier offset adjustment of the phase signal to generate an adjusted phase signal; and
a decoder block to decode the adjusted phase signal.

2. A system comprising:
the phase detector of claim 1;
an amplifier to receive a baseband signal;
a clock generator to generate a clock signal; and
a first multiplier to generate an in-phase signal based on an output of the amplifier and an output of the clock generator,
wherein the digitized in-phase signal is based on the in-phase signal.

3. The system of claim 2, further comprising:
a phase shifter to receive the clock signal; and
a second multiplier to generate a quadrature signal based on the output of the amplifier and an output of the phase shifter,
wherein the digitized quadrature signal is based on the quadrature signal.

4. The system of claim 3, further comprising:
a first analog filter to filter the in-phase signal;
a second analog filter to filter the quadrature signal;
a first analog to digital converter to generate the digitized in-phase signal based on an output of the first analog filter; and
a second analog to digital converter to generate the digitized quadrature signal based on an output of the second analog filter.

5. A phase detector including:
a decimator to decimate a digitized in-phase signal and a digitized quadrature signal to N times a symbol rate, where N is an integer greater than one;
a burst sync block to detect a burst based on an output of the decimator;
a time division multiple access (TDMA) block to generate a slot timing signal based on an output of the burst sync block;
a clock recovery block to estimate a timing offset based on the slot timing signal;
an interpolator to perform timing adjustment and rate conversion based on the timing offset;
an arctangent block to convert an output of the interpolator into a phase signal;
a carrier recovery block to perform carrier offset adjustment of the phase signal to generate an adjusted phase signal; and
a decoder block to decode the adjusted phase signal.

6. A system comprising:
the phase detector of claim 5;
an amplifier to receive a baseband signal;
a clock generator to generate a clock signal; and
a first multiplier to generate an in-phase signal based on an output of the amplifier and the clock signal,
wherein the digitized in-phase signal is based on the in-phase signal.

7. The system of claim 6, further comprising:
a phase shifter to receive the clock signal; and
a second multiplier to generate a quadrature signal based on the output of the amplifier and an output of the phase shifter,
wherein the digitized quadrature signal is based on the quadrature signal.

8. The system of claim 7, further comprising:
a first analog filter to filter the in-phase signal;
a second analog filter to filter the quadrature signal;
a first analog to digital converter to generate the digitized in-phase signal based on an output of the first analog filter; and
a second analog to digital converter to generate the digitized quadrature signal based on an output of the second analog filter.

* * * * *